United States Patent [19]

Mori et al.

[11] Patent Number: 5,539,244

[45] Date of Patent: Jul. 23, 1996

[54] POWER SEMICONDUCTOR DEVICE

[75] Inventors: Mutsuhiro Mori; Yasumichi Yasuda, both of Hitachi; Hiroyuki Ozawa, Katsuta; Jin Onuki, Hitachi, all of Japan

[73] Assignee: Hitachi, Ltd., Tokyo, Japan

[21] Appl. No.: 205,387

[22] Filed: Mar. 4, 1994

[30] Foreign Application Priority Data

Mar. 12, 1993 [JP] Japan ................................. 5-052305

[51] Int. Cl.$^6$ ............................. H01L 23/48; H01L 29/43
[52] U.S. Cl. .......................... 257/784; 257/584; 257/771
[58] Field of Search ...................... 257/771, 784, 257/765, 754, 584

[56] References Cited

U.S. PATENT DOCUMENTS

| 4,635,091 | 1/1987 | Roger | 257/771 |
| 4,754,318 | 6/1988 | Momose et al. | 257/754 |
| 4,761,386 | 8/1988 | Buynoski | 257/784 |
| 4,888,306 | 12/1989 | Komatsu et al. | 257/765 |
| 5,160,985 | 11/1992 | Akiyama | 257/145 |

FOREIGN PATENT DOCUMENTS

| 0395072 | 4/1990 | European Pat. Off. . |
| 3230760A1 | 8/1982 | Germany . |
| 54-26660 | 2/1979 | Japan . |
| 56-38843 | 4/1981 | Japan . |
| 0391240 | 4/1991 | Japan . |

OTHER PUBLICATIONS

Koyama et al., "A New Bond Failure Wire Crater In Surface Mount Device", IEEE/IRPS, 1988, pp. 59–63.
Koch et al., "A Bond Failure Mechanism", IEEE/IRPS, 1986, pp. 55–60.
Johnson et al., "Silicon Percipitate Nodule–Induced Failures of MOSFETS", ISTFA, 1991, pp. 161–165.

*Primary Examiner*—Jerome Jackson, Jr.
*Assistant Examiner*—Nathan K. Kelley
*Attorney, Agent, or Firm*—Antonelli, Terry, Stout & Kraus

[57] ABSTRACT

A first power semiconductor device with a semiconductor base to which an emitter wire electrode is connected through an emitter bonding pad and a gate wire electrode is connected through a gate bonding pad, wherein the gate bonding pad comprises a silicon oxide film, a silicon crystal layer and a gate wiring electrode made of aluminum containing silicon which are successively formed on the semiconductor base, and the gate wire electrode is connected to the gate wiring electrode. A second power semiconductor device wherein the emitter bonding pad is an emitter wiring electrode made of aluminum containing silicon which is directly formed on the semiconductor base, and the emitter wire electrode is bonded to the emitter wiring electrode.

16 Claims, 3 Drawing Sheets

POWER SEMICONDUCTOR DEVICE

FIELD OF THE INVENTION

The present invention relates to a power semiconductor device such as a power insulated-gate-bipolar-transistor (hereinafter referred to as IGBT) and, more particularly, to a power semiconductor device such as an IGBT which enables highly reliable wire bonding by decreasing the occurrence of deterioration in the blocking voltage when wire electrodes are bonded to the power semiconductor device through bonding pads.

TECHNICAL BACKGROUND

Conventionally, the IGBT has been known as a power semiconductor device which can operate at a relatively high speed and which can also deal with a great amount of power. The application of IGBT devices in great-power control apparatus has been increasing in recent years.

Figure 5:
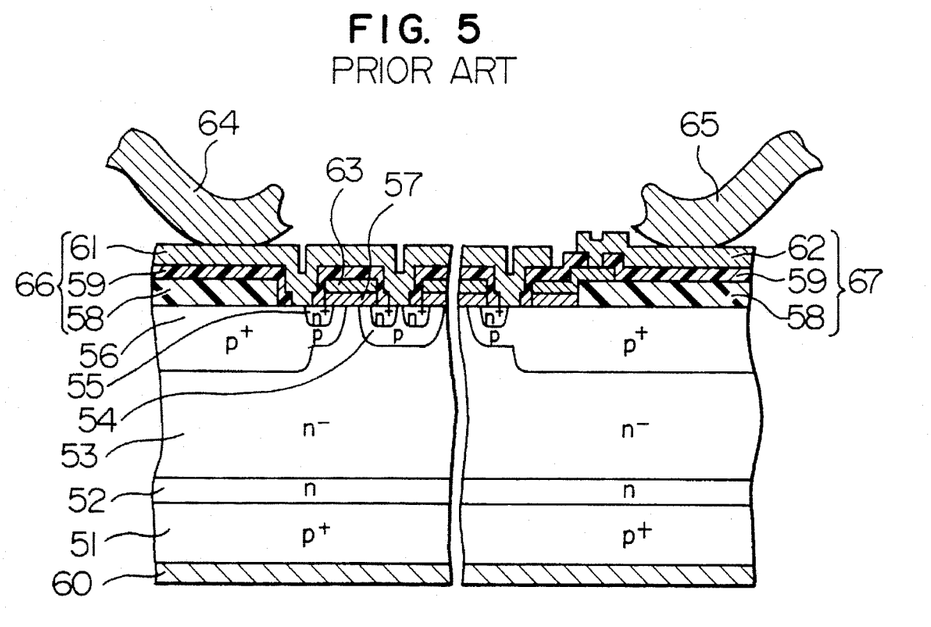
FIG. 5 is a cross-sectional view showing one example of the structure of a conventional power semiconductor device (IGBT)

FIG. 5 is a cross-sectional view showing one example of the structure of the conventional IGBT.

The IGBT comprises a high-concentration p-type semiconductor ($p^+$) substrate 51, an n-type semiconductor buffer layer (an n-buffer-layer) 52, a low-concentration n-type semiconductor ($n^-$)layer 53, p-type semiconductor (p) regions 54, high-concentration n-type semiconductor ($n^+$) regions 55, high-concentration p-type semiconductor ($p^+$) regions 56, gate oxide films 57, first silicon oxide films 58, second silicon oxide films 59, a collector electrode 60, an emitter wiring electrode 61, a gate wiring electrode 62, gate electrodes 63, an emitter wire electrode 64 and a gate wire electrode 65. An emitter bonding pad region 66 of the IGBT is constituted of the first silicon oxide film 58, the second silicon oxide film 59 and the emitter wiring electrode 61. A gate bonding pad region 67 is constituted of the first silicon oxide film 58, the second silicon oxide film 59 and the gate wiring electrode 62.

The n-buffer layer 52 and the $n^-$ layer 53 are successively formed over the substrate 51, thus constituting a base body. The $p^+$ regions 56 are formed on those portions of the base body surface on the $n^-$ layer 53 side which corresponds to the emitter bonding pad region 66 and the gate bonding pad region 67, and also, the p regions 54 are formed on the other portions of the base body surface. The collector electrode 60 is formed on the base body surface on the $p^+$ substrate 51 side. One or more $n^+$ regions 55 are formed inside of each of the p 54. The first silicon oxide films 58 are formed on the surfaces of the $p^+$ regions 56, and then, the second silicon Oxide films 59 are formed on the first silicon oxide films 58, thereby forming the emitter bonding pad region 66 and the gate bonding pad region 67. The gate oxide film 57 is formed between adjacent two of the $n^-$ regions 55 so as to extend over the regions 54 and the $n^-$ layer 53, and the gate oxide film 57 is also formed partially on the surfaces of the $p^+$ regions 56. The gate electrodes 63 are disposed on these gate oxide films 57, and then, the second silicon oxide films 59 are formed on these gate electrodes 63. The emitter wiring electrode 61 is formed on the second silicon oxide films 59 except the gate bonding pad region 67, and the emitter wiring electrode 61 is electrically connected to the $n^+$ regions 55 and the regions 54 through those portions where the second silicon oxide film 59 is not provided. The gate wiring electrode 62 is formed on the second silicon oxide film 59 in the gate bonding pad region 67, and the gate wiring electrode 62 is electrically connected to the gate electrodes 63 through that portions where the second silicon oxide film 59 is not provided. The emitter wire electrode 64 made of aluminum, gold or the like is bonded on the surface of the emitter wiring electrode 61 by ultrasonic bonding, and also, the gate wire electrode 65 made of aluminum, gold or the like is bonded on the surface of the gate wiring electrode 62 by ultrasonic bonding.

In this case, the first and second silicon oxide films 58 and 59 are interposed between the emitter wiring electrode 61 and the $p^+$ region 56 and between the gate wiring electrode 62 and the $p^+$ region 56, so that pressures exerted on the $p^+$ regions 56 are lessened when the emitter wire electrode 64 is bonded on the emitter wiring electrode 61 and when the gate wire electrode 65 is bonded on the gate wiring electrode 62, thereby preventing silicon crystal in the $p^+$ regions 56 from being broken by the above-mentioned pressures.

The IGBT with the above-described structure operates in the following manner.

A low (−) potential is applied to the emitter wiring electrode 61 through the emitter wire electrode 64, a high (+) potential is applied to the collector electrode 60, and a high (+) potential is applied to the gate wiring electrode 62 through the gate wire electrode 65. An n inversion layer is formed on the surface of the p region 54 in the vicinity of the gate oxide film 57 under the gate wiring electrode 62, and an electron current flows to the $p^+$ substrate 51 via the layer 55, the above-mentioned n inversion layer, the $n^-$ layer 53 and the n buffer layer 52. This electron current promotes injection of hole current from the $p^+$ substrate 51, and consequently, conductivity of the n buffer layer 52 and the $n^-$ layer 53 are modulated to thereby generate an electric current flowing from the collector electrode 60 to the emitter wiring electrode 61. At this time, modulation of the conductivity of the $n^-$ layer 53 causes a resistance in the IGBT to be about one hundredth lower so that a large current can be conducted in the IGBT.

Such an IGBT can conduct a current larger than other power transistors. For example, when comparisons are performed with elements of voltage capacity 600 V, the current capacity of the IGBT is about twice larger than that of a bipolar transistor and about four times larger than that of a power MOSFET. As a result, for example, while a chip of 7 mm square is required for constituting a bipolar transistor of current capacity 25 A, an IGBT of the same current capacity 25 A can be constituted by a smaller chip of about 5 mm square.

By the way, since a bipolar transistor and an IGBT having the same current capacity require emitter wire electrodes having the same diameter and emitter bonding pad regions having the same area, this type of IGBT involves a structural problem that it has a higher ratio of an area occupied by the bonding pad region on the chip than the bipolar transistor.

Figure 6:
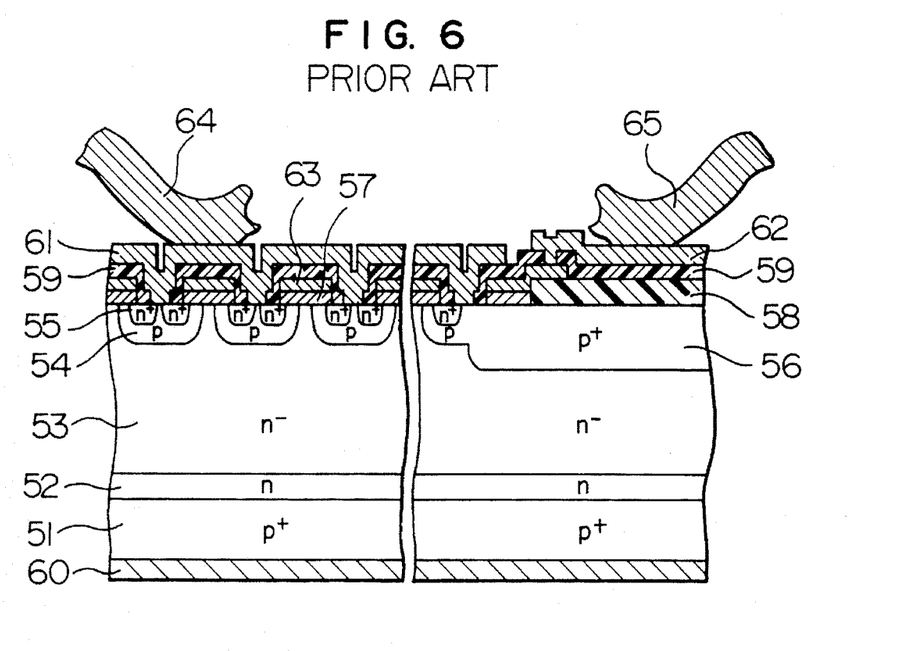
FIG. 6 is a cross-sectional view showing another example of the structure of a conventional power semiconductor device (IGBT).

FIG. 6 is a cross-sectional view showing one example of the structure of a conventional IGBT intended to solve this structural problem. In FIG. 6, the same component parts as shown in FIG. 5 are denoted by common reference numerals.

The example of IGBT shown in FIG. 5 (hereinafter referred to as the first example) and the example of IGBT shown in FIG. 6 (hereinafter referred to as the second example) have a mere difference in that the emitter bonding pad region 66, to which the emitter wire electrode 64 is bonded, is provided in the IGBT in the first example whereas, in the second example, the emitter wire electrode 64 is directly bonded to the emitter wiring electrode 61 formed on the gate electrode 63 so that the IGBT does not include the emitter bonding pad region 66. Except for this difference, the first example and the second example are structurally the same.

According to the second example, the region in which an emitter current directly flows (the current conduction region) also functions as the wire bonding region for the emitter wire electrode 64. Consequently, when the second example is compared with the first example having substantially the same size, a ratio of occupation of the current conduction region in the IGBT can be made much higher than that of the first example, and also, processing of a great current can be dealed with.

Especially recently, in the field of IGBT, the chip size has been enlarged, and parallel connection of chips has been developed. As a result, IGBT devices which can deal with a great current of about several hundred ampere (A) are available in the market. In the case where an IGBT of such a structure is arranged to have the structure of the first example, the emitter bonding pad regions 66 must be formed at several tens of positions so that the emitter bonding pad regions 66 will occupy an extremely large area. However, the second example is highly advantageous in that it does not require such an occupied area.

In each of the conventional IGBT devices described above, a current is relatively small, and therefore, wire electrodes having a small diameter are employed. For example, the emitter wire electrode 64 made of aluminum having a diameter of 300 microns (μm) is bonded to the emitter bonding pad region 66. In this case, silicon crystal in the $\underline{p^+}$ region 56 are hardly damaged by the pressure at the time of the bonding operation.

However, in order to increase a current to be dealed by the IGBT, the diameter of the emitter wire electrode 64 must be enlarged. When the emitter wire electrode 64 having the enlarged diameter is bonded to the emitter bonding pad region 66, silicon crystal in the $\underline{p^+}$ region 56 are damaged by a large pressure generated at the time of the bonding operation, thereby deteriorating the blocking voltage of the IGBT. Similarly, when the gate wire electrode 65 is bonded to the gate bonding pad region 67, substantially the same phenomenon induces deterioration of the blocking voltage. In this case, the rate of occurrence of the blocking voltage deterioration increases as the diameter of the emitter wire electrode 64 and the gate wire electrode 65 is enlarged in accordance with an increase in the current to be dealed by the IGBT. For example, when the diameter of the emitter wire electrode 64 and the gate wire electrode 65 is about 500 microns (μm), deterioration in the blocking voltage of the IGBT is exhibited quite remarkably.

The present invention has been proposed to solve the problem of deterioration in the blocking voltage.

SUMMARY OF THE INVENTION

Thus, an objective of the present invention resides in providing a power semiconductor device which blocking voltage is not deteriorated by pressures generated when wire electrodes having relatively large diameters are bonded to bonding pads.

In order to achieve the objective, the following power semiconductor device is provided.

A power semiconductor device with a semiconductor base to which an emitter wire electrode is connected through an emitter bonding pad and a gate wire electrode is connected through a gate bonding pad, wherein the gate bonding pad comprises a silicon oxide film, a silicon crystal layer and a gate wiring electrode made of aluminum containing silicon which are successively formed on the semiconductor base, and the gate wire electrode is connected to the gate wiring electrode.

The following structures may be proposed as two modified forms of the semiconductor device.

One of them is the above-mentioned semiconductor device which further includes a gate oxide film directly formed on the semiconductor base, and a gate electrode formed on the gate oxide film, the emitter bonding pad being formed on the gate electrode, the emitter bonding pad comprising an emitter wiring electrode made of aluminum containing silicon to which the emitter wire electrode is bonded, a silicon crystal layer disposed on that side of the emitter wiring electrode which faces the semiconductor base, and a silicon oxide film disposed between the silicon crystal layer and the gate electrode.

The other is the latter semiconductor device wherein the gate bonding pad comprises a gate wiring electrode made of aluminum containing silicon to which the gate wire electrode is bonded, a silicon crystal layer disposed on that side of the gate wiring electrode which faces toward the semiconductor base, and a second silicon oxide film disposed on that side of the silicon crystal layer which faces toward the semiconductor base.

From a different point of view, a power semiconductor device according to the present invention can be provided in the following form a, or b or c.

a) A power semiconductor device to which an emitter wire electrode is connected through an emitter bonding pad disposed on a semiconductor base and a gate wire electrode is connected through a gate bonding pad disposed on the semiconductor base, wherein the emitter bonding pad is constituted of an emitter wiring electrode made of aluminum containing silicon to which the emitter wire electrode is bonded and which is directly formed on the semiconductor base, and the gate bonding pad comprises a gate wiring electrode made of aluminum containing silicon to which the gate wire electrode is bonded, a silicon crystal layer disposed on that side of the gate wiring electrode which faces toward the semiconductor base, and a silicon oxide film disposed between the silicon crystal layer and the semiconductor base.

b) A power semiconductor device to which an emitter wire electrode is connected through an emitter bonding pad disposed on the surfaces of gate electrode which are formed on a semiconductor base through a gate oxide film, and a gate wire electrode is connected through a gate bonding pad disposed on the semiconductor base, wherein the emitter bonding pad comprises an emitter wiring electrode made of aluminum containing silicon to which the emitter wire electrode is bonded, a silicon crystal layer disposed on that side of the emitter wiring electrode which faces toward the semiconductor base, and a silicon oxide film disposed between the silicon crystal layer and the gate electrode, and the gate bonding pad comprises a gate wiring electrode made of aluminum containing silicon to which the gate wire electrode is bonded, a silicon crystal layer disposed on that side of the gate wiring electrode which faces toward the semiconductor base, and a second silicon oxide film disposed on that side of the silicon crystal layer which faces toward the semiconductor base.

c) A power semiconductor device with a semiconductor base to which an emitter wire electrode is connected through an emitter bonding pad and a gate wire electrode is connected through a gate bonding pad, wherein said emitter bonding pad is an emitter wiring electrode made of aluminum containing silicon which is directly formed on said semiconductor base, and the emitter wire electrode is bonded to said emitter wiring electrode.

The emitter bonding pad region of the power semiconductor device (IGBT) $\underline{a}$ (the above Item a) is only constituted of the emitter wiring electrode made of aluminum containing silicon, and this emitter wiring electrode is in direct contact with the $\underline{p^+}$ layer of silicon. Therefore, even if silicon particles precipitate and grow in the emitter wiring electrode in the vicinity of the interface with the $\underline{p^+}$ layer, the silicon particles have flat shapes, not acute shapes. Consequently, the precipitated silicon particles do not exert concentrated forces on the $\underline{p^+}$ layer due to the pressure when the emitter wire electrode is bonded on the emitter bonding pad region, thereby preventing formation of cracks in the $\underline{p^+}$ layer and so forth. On the other hand, the gate bonding pad region of the power semiconductor device (IGBT) comprises the gate wiring electrode made of aluminum containing silicon, the silicon crystal layer in contact with the gate wiring electrode, and the silicon oxide film in contact with the silicon crystal layer. The gate wiring electrode is likewise in contact with the silicon crystal layer. Therefore, even if silicon particles precipitate and grow in the gate wiring electrode in the vicinity of the interface with the silicon crystal layer, the silicon particles have flat shapes, not acute shapes, in substantially the same manner as described above. Consequently, the precipitated silicon particles do not exert concentrated forces on the silicon crystal layer or the silicon oxide film due to the pressure when the gate wire electrode is bonded on the gate bonding pad region thereby preventing formation of cracks in the silicon crystal layer, the silicon oxide film and so forth.

In the case of the semiconductor device $\underline{a}$, a breakage phenomenon is not caused in the power semiconductor device (IGBT) by pressure when the emitter wire electrode and the gate wire electrode having relatively large diameters are bonded to the emitter bonding pad region and the gate bonding pad region. Thus, the blocking voltage of the power semiconductor device (IGBT) is not deteriorated.

The emitter bonding pad region of the power semiconductor device (IGBT) $\underline{b}$ (the above Item b) comprises the emitter wiring electrode made of aluminum containing silicon, the silicon crystal layer in contact with the emitter wiring electrode, and the silicon oxide film in contact with the silicon crystal layer. The gate bonding pad region of the power semiconductor device (IGBT) comprises the gate wiring electrode made of aluminum containing silicon, the silicon crystal layer in contact with the gate wiring electrode, and the silicon oxide film in contact with the silicon crystal layer. Since both the emitter wiring electrode and the gate wiring electrode are contacted with the silicon crystal layers in this manner, silicon particles Which precipitate and grow in the emitter wiring electrode and the gate wiring electrode, respectively, have flat shapes. Consequently, the precipitated silicon particles do not exert concentrated forces on the silicon crystal layers or the silicon oxide films due to the pressures when the emitter wire electrode and the gate wire electrode are bonded to the emitter bonding pad region and the gate bonding pad region, respectively, thereby preventing formation of crackings in the silicon crystal layers, the silicon oxide films and so forth.

In the case of the semiconductor device $\underline{b}$ as well, a breakage phenomenon is not caused in the power semiconductor device (IGBT) by the pressures when the emitter wire electrode and the gate wire electrode having relatively large diameters are bonded to the emitter bonding pad region and the gate bonding pad region, respectively. Thus, the blocking voltage of the power semiconductor device (IGBT) is not deteriorated.

It is noted that in the invention device, silicon precipitates in the layer of the aluminum containing silicon in the vicinity of or adjacent to the interface between the aluminum layer and the silicon crystal layer exist along the interface and also have generally flat shapes, and that when each of the particles has an outer diameter $\underline{m}$ in a direction parallel to the interface and an outer diameter $\underline{n}$ in a direction perpendicular to the interface, the formula m >n is established. Advantages of this condition will be described later.

DETAILED DESCRIPTION OF THE INVENTION

The semiconductor devices (IGBT) shown in FIGS. 5 and 6 involve the drawbacks described above. That is to say, the emitter wire electrode 64 and the gate wire electrode 65 are bonded to the emitter bonding pad region and the gate bonding pad region under pressure, respectively. At this time, when the diameter of the electrodes exceeds 300 µm and is as large as about 500 µm, the blocking voltage of the IGBT is deteriorated.

The present inventors investigated the reason of deterioration in the pressure resistance of the IGBT and found out that a breakage phenomenon, which will be described below, occurs in the IBT when the emitter wire electrode 64 and the gate wire electrode 65 are bonded to the emitter bonding pad region 66 and the gate bonding pad region 67, respectively, and that the blocking voltage of the IGBT is deteriorated by the breakage phenomenon.

Figure 4:
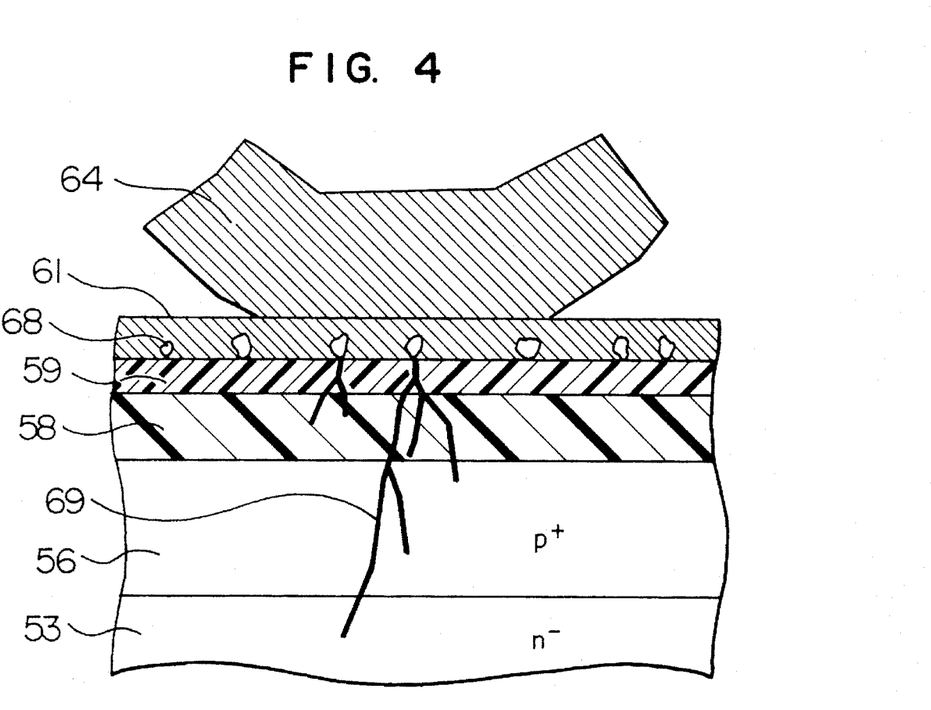
FIG. 4 is a cross-sectional view showing the structure of that portion of a conventional semiconductor device shown in FIG. 5 which is located in the vicinity of an emitter bonding pad region, on the basis of speculations about the conventional example by the present inventors.

FIG. 4 is a cross-sectional view showing the structure of that portion of the IGBT shown in FIG. 5 which is located in the vicinity of the emitter bonding pad region to which the emitter wire electrode is bonded.

In FIG. 4, reference numeral 68 denotes a silicon particle, and 69 a crack. The other component parts are substantially the same as shown in FIG. 5, and are designated by common reference numerals.

Generally, an aluminum material used for semiconductor devices contains several % silicon so that when aluminum and a silicon substrate are arranged to be in contact with each other, the silicon substrate is prevented from being melted by aluminum during a heat treatment. An aluminum material containing several % silicon is likewise employed for the emitter wiring electrode 61. In the case of the emitter wiring electrode 61 made of aluminum containing several % silicon and the second silicon oxide film 59 in contact with it, as shown in FIG. 4, silicon in the emitter wiring electrode 61 partially precipitates, in the form of silicon particles 68, in the emitter wiring electrode 61 in the vicinity of or adjacent to the interface between the second silicon oxide film 59 and the emitter wiring electrode 61 at the time of the heat treatment during the manufacturing process of the IGBT. Some of the precipitated silicon particles 68 grow into acute shapes projecting toward the second silicon oxide film 59. When the emitter wire electrode 64 is bonded to the emitter wiring electrode 61 by means of an ultrasonic bonding apparatus, the silicon particles 68 of the acute shapes exert concentrated forces on parts of the silicon oxide film 59 owing to a pressure at the time of the bonding operation. As a result, crackings 69 starting from the above-mentioned silicon particles 68 are generated in the silicon oxide film 59. When the crackings 69 progress further deeply, they pass the range of the second silicon oxide film 59 and the first silicon oxide film 58 and reach a portion below the $\underline{p^+}$ region 56, thus breaking the $\underline{pn}$ bonded portion consisting of the $\underline{p^+}$ region 56 and the $\underline{n^-}$ layer 53.

Heretofore, the breakage phenomenon in the IGBT has been described in relation to the emitter bonding pad region 66. However, substantially the same breakage phenomenon occurs in the gate bonding pad region 67. Especially when such crackings 69 as described above are generated in the first and second silicon oxide films 58 and 59 under the gate wiring electrode 62, insulation of the MOS gate is deteriorated, and consequently, the reliability of the IGBT is terribly degraded.

Further, the breakage phenomenon in the IGBT occurs not only in the type shown in FIG. 5 in which the emitter bonding pad region 66 is provided in the IGBT but also in the type shown in FIG. 6 in which the emitter wire electrode 64 is bonded to the current conduction region. Especially, deterioration in the blocking voltage is conspicuously exhibited in the type shown in FIG. 6.

As described above, in the conventional IGBT, when the diameter of the wire electrodes to be bonded is enlarged, crackings 69 are generated in the first and second silicon oxide films 58, 59 and the $\underline{p^+}$ regions 56 by pressure at the time of wire bonding operation of the wire electrodes, thereby deteriorating the blocking voltage of the IGBT. The conventional IGBT involves a problem that it is difficult to effect bonding of the large-diameter wire electrodes without deteriorating the pressure resistance of the IGBT.

In order to change the precipitation state of silicon particles in a layer of aluminum containing silicon, the present inventors have decided to provide a silicon crystal layer of monocrystalline silicon, polycrystalline silicon, metal silicide crystals or the like to be in contact with the aluminum layer.

Figure 2:
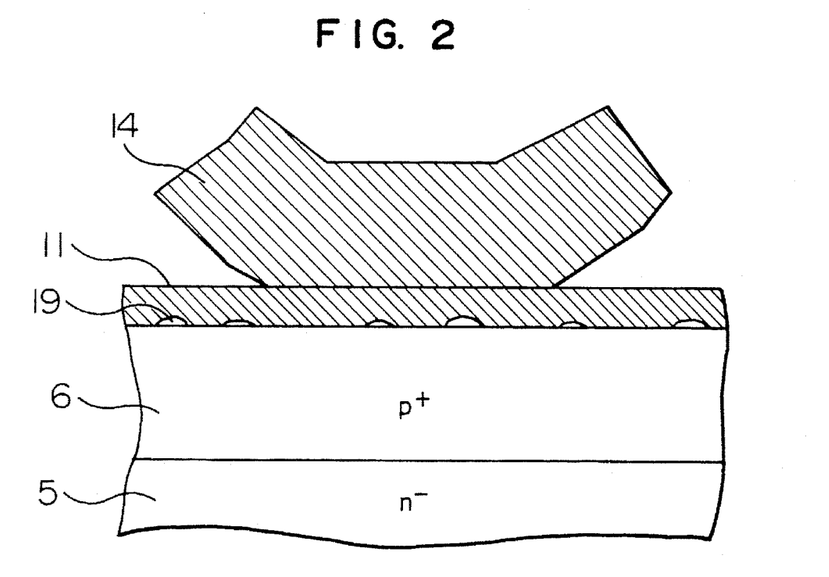
FIG. 2 is a cross-sectional view showing the structure of that portion of the embodiment shown in FIG. 1 which is located in the vicinity of an emitter bonding pad region.

With such arrangement, in the process of heat treatment of the semiconductor device, precipitated silicon particles in the aluminum layer grow while their growth is restricted by crystal orientation of the silicon crystal layer so that the silicon particles in the vicinity of or adjacent to the interface of the aluminum layer in contact with the silicon crystal layer have flat shapes along the interface, as shown in FIG. 2. When the particles having such flat shapes have an outer diameter $\underline{m}$ in a direction parallel to the interface and an outer diameter $\underline{n}$ in a direction perpendicular to the interface, the formula m >n is established. Even if such particles having the flat shapes exist, cracks are not generated in the silicon crystal layer and the adjacent layers on the semiconductor base side due to concentrated loads when the wire electrodes are pressed, for bonding, against the aluminum layer. In this manner, the structure of the present invention enables effective prevention of the pressure resistance deterioration of the IGBT.

PREFERRED EMBODIMENTS

Figure 1:
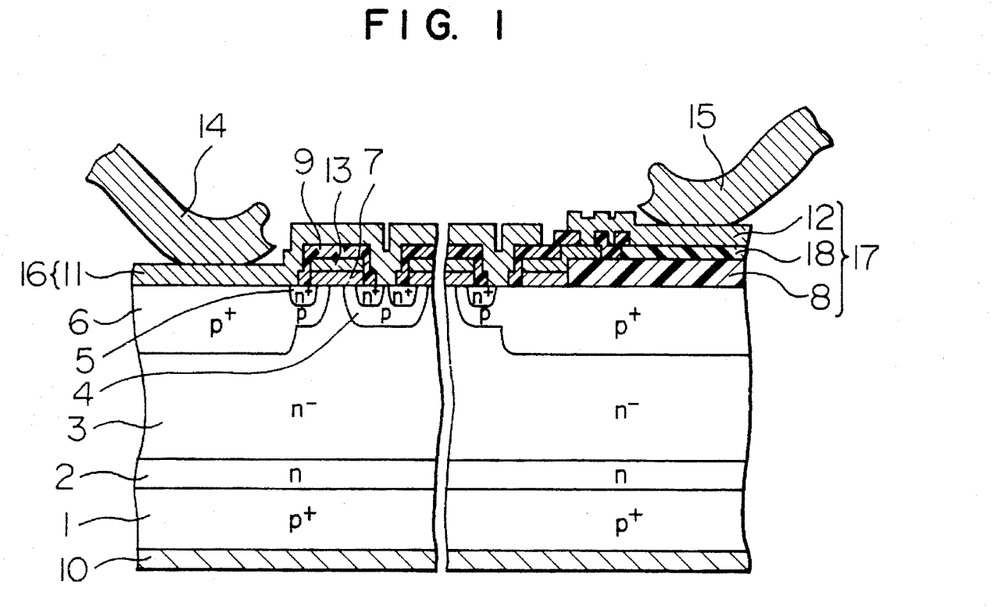
FIG. 1 is a cross-sectional view showing the structure of a first embodiment of a power semiconductor device (IGBT) according to the invention.

FIG. 1 is a cross-sectional view showing the structure of a first embodiment of a power semiconductor device according to the present invention which is applied to an IGBT.

In FIG. 1, reference numeral 1 denotes a high-concentration p-type semiconductor ($p^+$) substrate, 2 an n-type semiconductor $\underline{n}$ buffer layer (an n $\underline{n}$ buffer layer), 3 a low-concentration n-type semiconductor ($n^{31}$) layer, 4 a p-type semiconductor (p) region, 5 a high-concentration n-type semiconductor ($n^+$) region, 6 a high-concentration p-type semiconductor ($p^+$) region made of silicon, 7 a gate oxide film, 8 a first silicon oxide film, 9 a second silicon oxide film, 10 a collector electrode, 11 denotes an emitter wiring electrode, 12 a gate wiring electrode, 13 a gate electrode, 14 an emitter wire electrode, 15 a gate wire electrode, 16 an emitter bonding pad region, 17 a gate bonding pad region, and 18 a silicon crystal layer. In this case, the emitter wiring electrode 11 alone constitutes the emitter bonding pad region 16, and the first silicon oxide film 8, the silicon crystal layer 18 and the gate wiring electrode 12 constitute the gate bonding pad region 17. The emitter wiring electrode 11 and the gate wiring electrode 12 are made of an aluminum material containing several % silicon, and the emitter wire electrode 14 and the gate wire electrode 15 are made of aluminum, gold or the like.

The $\underline{n}$ buffer layer 2 and the $\underline{n^-}$ layer 3 are successively formed over the $\underline{p^+}$ substrate 1, thus constituting a base body. The $\underline{p^+}$ regions 6 are formed on those portions of the base body surface on the $\underline{n^-}$ layer 3 side which corresponds to the emitter bonding pad region 16 and the gate bonding pad region 17, and also, the $\underline{p}$ 4 are formed on the other portions of the base body surface whereas the collector electrode 10 is formed on the base body surface on the $\underline{p^+}$ substrate 1 side. One or more $\underline{n^+}$ regions 5 are formed inside of each of the $\underline{p}$ 4. The gate oxide film 7 is formed between adjacent two of the $\underline{n^-}$ regions 5 so as to extend over the $\underline{p}$ 4 and the $\underline{n^-}$ layer 3, and the gate electrode 31 is disposed on the gate oxide film 7. The emitter wiring electrode 11 is formed on the gate oxide films 7 and the gate electrodes 13 and extends over the surface Of the $\underline{p^+}$ region 6, thereby forming the emitter bonding pad region 16 while the emitter wiring electrode 11 is electrically connected to the $\underline{n^+}$ regions 5 and the $\underline{p}$ regions 3 through those portions where the second silicon oxide films 9 are not provided. The first silicon oxide film 8 and the gate oxide film 7 are adjacently formed on the surface of the $\underline{p^+}$ region 6 in the gate bonding pad region 17 and its neighboring portion, and the silicon crystal layer 18 is formed on the first silicon oxide film 8. The gate electrode 13 is formed on the gate oxide film 7, and one end of the gate electrode 13 extends to the surface of the silicon oxide film 8. The second silicon oxide film 9 is formed on the gate oxide film 7 and the gate electrode 13, and the gate wiring electrode 12 is formed on the silicon crystal layer 18 and the second silicon oxide film 9. The gate wiring electrode 12 is electrically connected t the gate electrode 13 through that portion where the second silicon oxide film 9 is not provided. The emitter wire electrode 14 is fixed on the surface of the emitter wiring electrode 11 by ultrasonic bonding, and also, the gate wire electrode 15 is bonded on the surface of the gate wiring electrode 12 by ultrasonic bonding. When the IGBT of this embodiment with the above-described structure and the conventional IGBT shown in FIG. 4 are compared with each other, they are substantially the same except for the structures of the emitter bonding pad region 16 and the gate bonding pad region 17.

The IGBT of this embodiment operates in substantially the same manner as the conventional IGBT shown in FIG. 4. A low (−) potential is applied to the emitter wiring electrode 11 through the emitter wire electrode 14, a high (+) potential is applied to the collector electrode 10, and a high (+) potential is applied to the gate wiring electrode 12 through the gate wire electrode 15. An n inversion layer is formed on the surface of the region 4 in the vicinity of the gate oxide film 7 under the gate wiring electrode 12, and an electron current flows to the p$^+$substrate 1 via the n$^+$ layer 5, the above-mentioned n inversion layer, the n$^-$ layer 3 and the n buffer layer 2. This electron current promotes injection of hole current from the p$^+$ substrate 1, and consequently, conductivity of the n buffer layer 2 and the n$^-$ layer 3 are modulated so that a great electric current flows from the collector electrode 10 to the emitter wiring electrode 11 in substantially the same manner as the conventional IGBT shown in FIG. 4.

The present embodiment is of the structure characterized in that, in the emitter bonding pad region 16, the emitter wiring electrode 11 made of aluminum containing silicon is in direct contact with the p$^+$ region 6 made of silicon, and also in the gate bonding pad region 17, the gate wiring electrode 12 made of aluminum containing silicon is in direct contact with the silicon crystal layer 18.

This structure has been achieved from the investigation by the present inventors, who found that when silicon particles precipitate and grow in the emitter wiring electrode 11 and the gate wiring electrode 12, the precipitated silicon particles have flat shapes, not acute shapes, as described below, by bringing the p$^+$ region 6 made of silicon and the silicon crystal layer 18 into direct contact with the emitter wiring electrode 11 ad the gate wiring electrode 12. When the shapes of the precipitated silicon particles are flat, concentrated forces are not exerted on portions of the p$^+$ region 6 and the silicon crystal layer 18 due to the pressure when the emitter wire electrode 14 is bonded to the emitter bonding pad region 16 and the pressure when the gate wire electrode 15 is bonded to the gate bonding pad region 17. Therefore, unlike the conventional IGBT, cracks are not generated in the p$^+$ region 6, the silicon crystal layer 18 and so forth.

FIG. 2 is a cross-sectional view showing the structure of that portion of the present embodiment which is located in the vicinity of the emitter bonding pad region 16 to which the emitter wire electrode 14 is bonded.

In FIG. 2, reference numeral 19 denotes a silicon particle. Other than that, the same component parts as shown in FIG. 1 are denoted by common reference numerals.

The emitter bonding pad region 16 is constituted of the emitter wiring electrode 11 on which the emitter wire electrode 14 is bonded, and the emitter wiring electrode 11 is in direct contact with the p$^+$ layer 6 made of silicon. Further, a large number of silicon particles 19 having flat shapes grow and are precipitated in the vicinity of the p$^+$ layer 6 inside of the emitter wiring electrode 11.

As described above, when the p$^+$layer 6 made of silicon (equivalent to a silicon substrate) is directly contacted with the emitter wiring electrode 11 made of aluminum containing silicon, any of the silicon particles 19 which precipitate and grow in the emitter wiring electrode 11 has a flat shape. This is presumably because of solid-phase growth of silicon in aluminum along the crystal axis of the silicon substrate. As a result, the pressure at the time of bonding of the emitter wire electrode 14 is not transmitted to a part of the p$^+$ layer 6 in a concentrated manner, thereby preventing formation of cracks in the p$^+$ layer 6 and so forth.

The above-described embodiment has related to the emitter bonding pad region 16. However, substantially the same effect is observed in the gate bonding pad region 17. When the silicon crystal layer 18 (equivalent to a silicon substrate) is directly contacted with the gate wiring electrode 12 made of aluminum containing silicon, the pressure at the time of bonding of the gate wire electrode 15 is not transmitted to a part of the silicon crystal layer 18 in a concentrated manner, thereby preventing formation of crackings in the silicon crystal layer 18, and the first silicon oxide film 8, the p$^+$ layer 6 and so forth beneath it.

In the above-described embodiment, the silicon crystal layer 18 is used to be directly contacted with the gate wiring electrode 12. The silicon crystal layer 18.according to the present invention is not limited to a silicon crystal layer 18 made of monocrystalline silicon. Substantially the same function and effect can be obtained even if a silicon crystal layer 18 made of polycrystalline silicon is used or a silicon crystal layer 18 made of silicide consisting of silicon and metal. Especially when a silicon crystal layer 18 made of polycrystalline silicon is used, the bottom of each silicon particle which precipitate and grows in the gate wiring electrode 12 grows around a core which is polycrystalline silicon in the silicon crystal layer 18, and consequently, the bottom area of the silicon particle increases so that the pressure at the time of bonding of the gate wire electrode 15 which is exerted on the silicon crystal layer 18 can be adequately prevented from concentrating.

In the case of an IGBT including an insulated MOS gate, an insulation film such as the first silicon oxide film 8 must be provided between the gate wiring electrode 12 and the base body 1 to the p$^+$ region 6 made of silicon so as to insulate and separate the gate wiring electrode 12 and the base body 1 to the p$^+$ region 6 from each other. With this structure, however, it is technically difficult to form the silicon crystal layer 18 under the gate wiring electrode 12, so that the silicon crystal layer 18 made of polycrystalline silicon or the silicon crystal layer 18 made of silicide should preferably be provided there. In the case of an IGBT including the silicon crystal layer 18 made of polycrystalline silicon of the gate electrode 13, deterioration in the blocking voltage due to a damage at the time of bonding can be made about 1/10 or lower as compared with the conventional IGBT shown in FIG. 4, without changing the manufacturing process.

Figure 3:
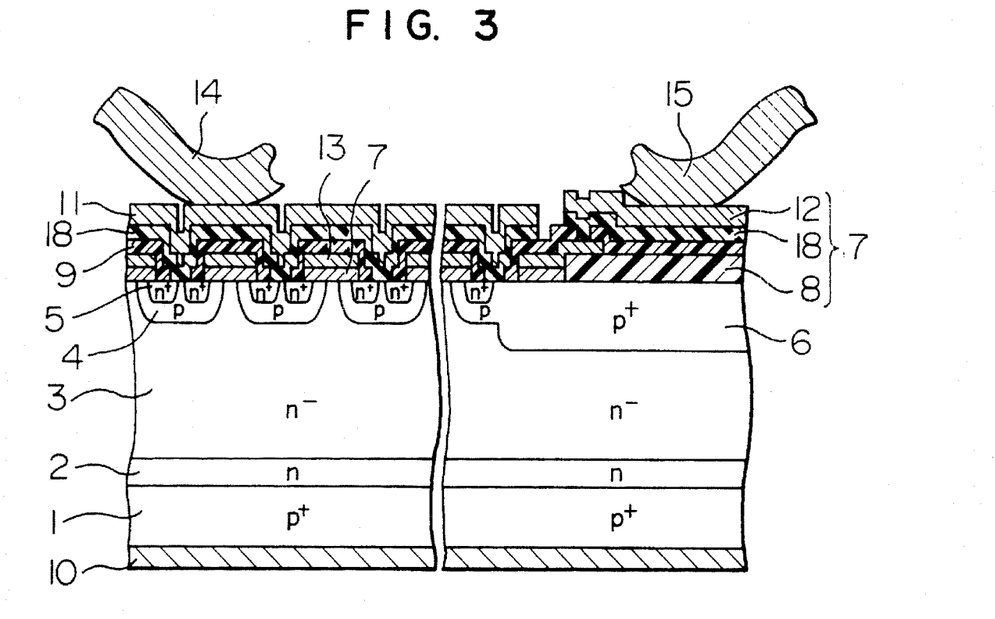
FIG. 3 is a cross-sectional view showing the structure of a second embodiment of a power semiconductor device (IGBT) according to the invention.

FIG. 3 is a cross-sectional view showing the structure of a second embodiment of a power semiconductor device according to the present invention which is applied to an IGBT of the type in which an emitter wire electrode is bonded to a current conduction region.

In FIG. 3, the same component parts as shown in FIG. 1 are denoted by common reference numerals.

This embodiment is structurally different from the above-described first embodiment in the following: an emitter wire electrode 14 is bonded to an emitter wiring electrode 11 in a current conduction region so as to eliminate the emitter bonding region 16 from the IGBT; silicon crystal layers 18 are disposed between the emitter wiring electrode 11 and a second silicon oxide film 9 and between the emitter wiring electrode 11 and a base body; and in a gate bonding region 17, a second silicon oxide film 9 is disposed between a silicon crystal layer 18 and a first silicon oxide film 8. Except for these differences, the present embodiment is structurally the same as the first embodiment.

In this embodiment, the silicon crystal layer 18 must be brought directly into ohmic contact with a $\underline{p}$ region 4 and an $\underline{n}^+$ layer 5. Therefore, a silicon crystal layer 18 made of silicide should preferably be employed, and particularly, molybdenum silicide, tungsten silicide or titanium silicide which can be contacted with the region 4 and the $\underline{n}^+$ layer 5 in a low resistance state should preferably be employed.

The operation of the present embodiment is substantially the same as the first embodiment so that the explanation will be omitted.

In the present embodiment, since the silicon crystal layers 18 are in contact with the emitter wiring electrode 11 and the gate wiring electrode 12, silicon particles which precipitate and grow in the emitter wiring electrode 11 and the gate wiring electrode 12 have flat shapes in substantially the same manner as the first embodiment. Therefore, pressures at the time of bonding the emitter wire electrode 14 and the gate wire electrode 15 will not be exerted on parts of the silicon crystal layers 18 in a concentrated manner, so that deterioration in the pressure resistance of the IGBT owing to a damage at the time of bonding can be prevented.

The foregoing embodiments have been described with the IGBT as a power semiconductor device. However, the present invention is not limited to the IGBT. Needless to say, the invention can be similarly applied to power semiconductor devices other than the IGBT.

The power semiconductor device in the sense of the present invention is a semiconductor device which can deal with a current of about 10 A or more, and inevitably, the invention is intended for a power semiconductor device in which an emitter wire electrode 14 and a gate wire electrode 15 have relatively large diameters.

As will be apparent from the above, according to the invention, in the emitter bonding pad region 16 and the gate bonding pad region 17, silicon substrates (the $\underline{p}^+$ region 6, the silicon crystal layer 18) are disposed in contact with the emitter wiring electrode 11 and the gate wiring electrode 12 which are made of aluminum containing silicon, so that silicon particles 19 which precipitate and grow in the emitter wiring electrode 11 and the gate wiring electrode 12 can have flat shapes. Consequently, when the emitter wire electrode 14 and the gate wire electrode 15 are bonded to the emitter bonding pad region 16 and the gate bonding pad region 17, respectively, pressures at the time of the bonding operations are not exerted on parts of the silicon substrates 6, 18 in a concentrated manner even if the emitter wire electrode 14 and the gate wire electrode 15 have relatively large diameters. Therefore, crackings are not generated in the silicon substrates 6, 18 and the like, thereby drastically decreasing deterioration in the blocking voltage of the power semiconductor device (IGBT).

Moreover, according to the invention, the emitter wire electrode 14 and the gate wire electrode 15 having relatively large diameters can be employed without deteriorating the pressure resistance of the power semiconductor device (IGBT), so that power semiconductor devices (IGBT) which can process a great current can be obtained at a favorable yield.

What is claimed is:

1. A power semiconductor device with a semiconductor base to which an emitter wire electrode is connected through an emitter bonding pad and a gate wire electrode is connected through a gate bonding pad, wherein said gate bonding pad comprises a first silicon oxide film, a silicon crystal layer and a gate wiring electrode comprised of aluminum containing silicon which are successively formed on said semiconductor base, and wherein said gate bonding pad includes means to avoid cracks in the semiconductor base during a wire bonding operation in which the gate wire electrode is bonded to the gate bonding pad, said means comprising said silicon crystal layer and said gate wiring electrode being in direct contact with each other, and said gate wire electrode being connected to said gate wiring electrode at a location directly above an area where said gate wiring electrode and said silicon crystal layer are in direct contact with each other, wherein said emitter bonding pad is an emitter wiring electrode comprised of aluminum containing silicon which is directly formed on said semiconductor base, and the emitter wire electrode is bonded to said emitter wiring electrode at a location directly above an area where said emitter wiring electrode is directly formed on said semiconductor base.

2. A power semiconductor device according to claim 1, wherein silicon particles precipitate in said gate wiring electrode along the interface between said gate wiring electrode and said silicon crystal layer, wherein each of the silicon particles has a generally flat shape, and wherein, when the silicon particle has an outer diameter m in a direction parallel to said interface and an outer diameter n in a direction perpendicular to said interface, the formula m>n is established.

3. A power semiconductor device according to claim 1, which further comprises gate oxide films directly formed on said semiconductor base, and gate electrodes formed on said gate oxide films, said emitter bonding pad being formed over said gate electrodes, said emitter bonding pad comprising an emitter wiring electrode comprised of aluminum containing silicon to which the emitter wire electrode is bonded, a silicon crystal layer in direct contact with the emitter wiring electrode on that side of said emitter wiring electrode which faces toward said semiconductor base, and a second silicon oxide film disposed between said silicon crystal layer and said gate electrode wherein the emitter wire electrode is bonded to the emitter wiring electrode at a location directly above an area where said emitter wiring electrode is in direct contact with the silicon crystal layer.

4. A power semiconductor device according to claim 1, wherein said gate bonding pad includes a second silicon oxide film disposed between said silicon crystal layer and said first silicon oxide film.

5. A power semiconductor device according to any one of claims 3 and 4, wherein silicon particles precipitate in said emitter wiring electrode along the interface between said emitter wiring electrode and said silicon crystal layer, wherein each of the silicon particles has a generally flat shape, and when the silicon particle has an outer diameter m in a direction parallel to said interface and an outer diameter n in a direction perpendicular to said interface, the formula m>n is established.

6. A power semiconductor device according to any one of claims 1 and 3, wherein said silicon crystal layer is composed of monocrystalline silicon.

7. A power semiconductor device according to any one of claims 1 and 3, wherein said silicon crystal layer is composed of polycrystalline silicon.

8. A power semiconductor device according to any one of claims 1 and 3, wherein said silicon crystal layer is composed of metal silicide crystals.

9. A power semiconductor device according to any one of claims 1 and 3, which is an insulated gate bipolar transistor.

10. A power semiconductor device with a semiconductor base to which an emitter wire electrode is connected through an emitter bonding pad and a gate wire electrode is connected through a gate bonding pad, wherein said emitter bonding pad is an emitter wiring electrode comprised of aluminum containing silicon which is directly formed on said semiconductor base to avoid cracks in the semiconductor base when the emitter wire electrode is bonded to said emitter wiring electrode, wherein the emitter wire electrode is bonded to the emitter wiring electrode at a location directly above an area where said emitter wiring electrode is in direct contact with said semiconductor base.

11. A semiconductor device with a semiconductor base to which a wire electrode is connected through a bonding pad, wherein said bonding pad is formed to include a wiring electrode comprised of aluminum containing silicon, wherein said wiring electrode of said bonding pad is formed directly on said semiconductor base so that silicon particles which precipitate in said wiring electrode along an interface of the wiring electrode and said semiconductor base will have a generally flat shape without acute edges at the interface to avoid cracks in the semiconductor base during a wire bonding operation in which the wire electrode is bonded to said bonding pad, and wherein said wire electrode is bonded to said bonding pad at a location directly above an area where said wiring electrode is formed directly on said semiconductor base.

12. A semiconductor device according to claim 11, wherein said semiconductor device includes an emitter region, and wherein said wire electrode is an emitter wire electrode, and said bonding pad is an emitter bonding pad.

13. A semiconductor device according to claim 11, wherein said semiconductor device includes a gate region, and wherein said wire electrode is a gate wire electrode, and said bonding pad is a gate bonding pad.

14. A semiconductor device according to claim 11, wherein said semiconductor device includes a gate electrode formed over a semiconductor substrate, and wherein said wire electrode is a gate wire electrode which is coupled to said gate electrode, and said bonding pad is a gate bonding pad.

15. A semiconductor device according to claim 14, wherein said semiconductor base comprises a silicon crystal layer formed over said semiconductor substrate.

16. A semiconductor device according to claim 15, wherein an oxide insulation layer is interposed between said silicon crystal layer and said semiconductor substrate.

* * * * *